(12) United States Patent
Huang et al.

(10) Patent No.: US 6,235,606 B1
(45) Date of Patent: May 22, 2001

(54) METHOD OF FABRICATING SHALLOW TRENCH ISOLATION

(75) Inventors: Michael W C Huang, Taipei Hsien; Kuo-Tai Huang, Hsinchu; Hsiao-Ling Lu, Chung Ho; Tri-Rung Yew, Hsinchu Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/225,031

(22) Filed: Jan. 4, 1999

(51) Int. Cl.[7] .................................................. H01L 21/76
(52) U.S. Cl. ............................................. 438/400; 438/424
(58) Field of Search ..................................... 438/243, 257, 438/400, 427, 436, 238, 424, 425, 435, 438

(56) References Cited

U.S. PATENT DOCUMENTS

| | | | |
|---|---|---|---|
| 5,843,820 | * 12/1998 | Lu ........................................ | 438/243 |
| 6,008,108 | * 12/1999 | Huang et al. ........................ | 438/436 |
| 6,048,775 | * 4/2000 | Yao et al. ............................. | 438/427 |
| 6,060,357 | * 5/2000 | Lee ...................................... | 438/257 |
| 6,110,795 | * 8/2000 | Liao ..................................... | 438/424 |

* cited by examiner

*Primary Examiner*—David Nelms
*Assistant Examiner*—Phuc T. Dang

(57) ABSTRACT

A method for fabricating a shallow trench isolation. A pad oxide layer and a mask layer are formed over a substrate. The pad oxide layer, the mask layer, and the substrate are patterned to form a trench exposing a portion of the substrate. A liner oxide layer is formed on the substrate exposed by the trench. An isolation layer is formed over the substrate to cover the liner oxide layer. The isolation layer is conformal to the trench. An oxide layer is formed over the substrate to fill the trench. A portion of the oxide layer and the isolation layer is removed until the mask layer is exposed. The mask layer and the pad oxide layer are removed to form a shallow trench isolation.

14 Claims, 6 Drawing Sheets

METHOD OF FABRICATING SHALLOW TRENCH ISOLATION

BACKGROUND OF THE INVENTION

1. Field of the Invention

The present invention relates to a semiconductor fabricating method. More particularly, the present invention relates to a method of fabricating an isolation region.

2. Description of the Related Art

Shallow trench isolation (STI) technique is widely used in a fabrication process for isolating complementary metal oxide semiconductors (CMOSs). A shallow trench isolation is formed by anisotropic etching the substrate to form a trench between a PMOS and an NMOS, followed by filling the trench with silicon oxide.

However, as the number of semiconductor devices increases and the linewidth of fabricating process is reduced, misalignment often occurs during a step of forming a metallic line. Once the misalignment occurs, the conductive line easily makes contact with a source/drain region of the MOS, which decreases the isolation ability of the shallow trench isolation. In addition, if the size of source/drain region is smaller than the size of the metallic line, the metallic line also easily makes contact with the source/drain region. In order to maintain the isolation ability of the shallow trench isolation, it becomes necessary to form a shallow trench isolation which can be utilized for a borderless contact fabrication process in the integrated circuit.

FIGS. 1A through 1H are schematic, cross-sectional views showing a conventional method of fabricating a shallow trench isolation used in a borderless contact fabrication process.

In FIG. 1A, a pad oxide layer 102 and a silicon nitride layer 104 are formed in sequence over a silicon substrate 100. The pad oxide layer 102, the silicon nitride layer 104, and the silicon substrate 100 are patterned. A trench 101 is formed in the silicon substrate 100. A liner oxide layer 106 is formed on the silicon substrate 100 exposed in the trench 101.

In FIG. 1B, an oxide layer 108 is formed over the silicon nitride layer 104 to fill the trench 101.

In FIG. 1C, chemical-mechanical polishing (CMP) is performed to remove a portion of the oxide layer 108 until the silicon nitride layer 104 is exposed.

In FIG. 1D, the silicon nitride layer 104 and the pad oxide layer 102 are removed. A shallow trench isolation 109 is formed. The shallow trench isolation 109 is composed of the liner oxide layer 106 and the oxide layer 108.

In FIG. 1E, a P-well 116 is formed in the substrate 100 and next to the shallow trench isolation 109. An NMOS is formed on the P-well 116 of the substrate 100. The NMOS comprises a gate 122 formed on the substrate 100, and a source/drain region 120 in the silicon substrate 100 beside the gate 122.

In FIG. 1F, a silicon nitride layer 110 is formed over the substrate 100 to cover the shallow trench isolation 109 and the gate 122. An interlayer dielectric 112 is formed over the silicon nitride layer 110.

In FIG. 1G, a patterned photoresist layer 114 is formed on the interlayer dielectric 112. The patterned photoresist layer 114 is used as a mask when the interlayer dielectric 112 exposed by the patterned photoresist layer 114 is patterned. The interlayer dielectric 112 is patterned until the silicon nitride layer 110 is exposed. An opening 115 is formed.

In FIG. 1H, the silicon nitride layer 110 exposed by the opening 115 is removed. The patterned photoresist layer 114 is removed. A metallic contact opening 117 is formed. However, over-etching often occurs while removing the silicon nitride layer 110. In this situation, the oxide layer 108 in the shallow trench isolation is easily removed when an opening 115 is misaligned. The thickness of the oxide layer 108 may even lose as much as about 500 Å, which reduces the isolation distance 118 between the contact opening 117 and the PN junction 119. Once the isolation distance 119 is reduced, junction leakage may occur. Thus, the possibility for device failure increases.

SUMMARY OF THE INVENTION

Accordingly, the purpose of the present invention is to provide a method of fabricating a shallow trench isolation which can be utilized in a borderless contact fabrication process.

To achieve these and other advantages and in accordance with the purpose of the invention, as embodied and broadly described herein, the invention provides a shallow trench isolation fabrication method. The shallow trench isolation of the invention comprises formation of a pad oxide layer and a mask layer over a substrate. The pad oxide layer, the mask layer, and the substrate are patterned to form a trench exposing a portion of the substrate. A liner oxide layer is formed on the substrate exposed by the trench. An isolation layer is formed over the substrate to cover the liner oxide layer. The isolation layer is conformal to the trench. An oxide layer is formed over the substrate to fill the trench. A portion of the oxide layer and the isolation layer is removed until the mask layer is exposed. The mask layer and the pad oxide layer are removed to form a shallow trench isolation. A well of a first conductive type is formed in the substrate of and next to the shallow trench isolation. A metallic oxide semiconductor (MOS) of a second conductive type is formed on the well. The MOS has a conductive region in the substrate. A stop layer is formed over the substrate to cover the MOS and the shallow trench isolation. An interlayer dielectric layer is formed over the substrate to cover the stop layer. The interlayer dielectric is patterned to form an opening until the stop layer is exposed. The opening is above the conductive region. The stop layer exposed by the opening is removed.

In the invention, the etching rate of the isolation layer is lower than the etching rate of silicon oxide or silicon nitride. The material of the isolation layer 208 preferably is silicon-rich oxide or silicon-rich nitride.

is It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
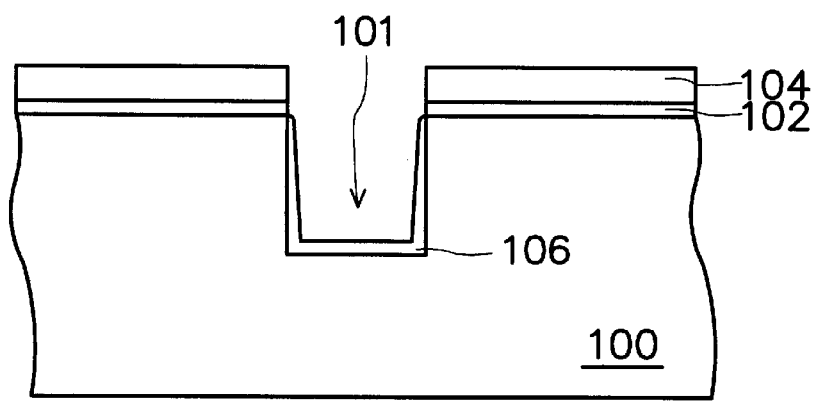
FIGS. 1A through 1H are schematic, cross-sectional views showing a conventional method of fabricating a shallow trench isolation.
Figure 1B:
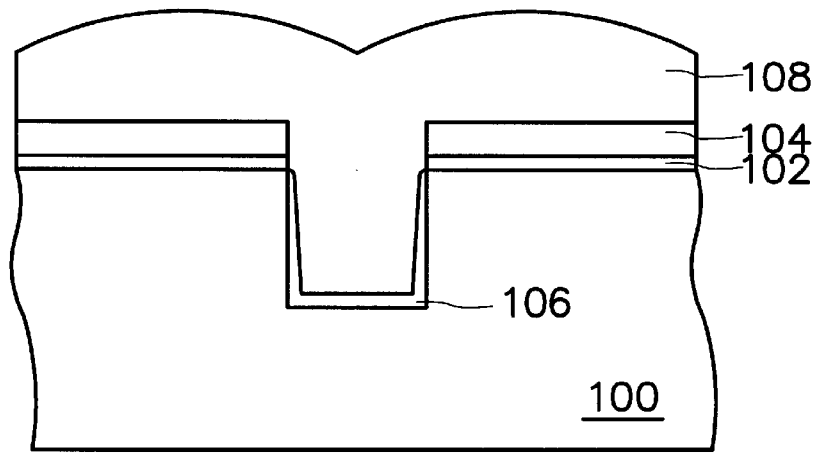
Figure 1C:
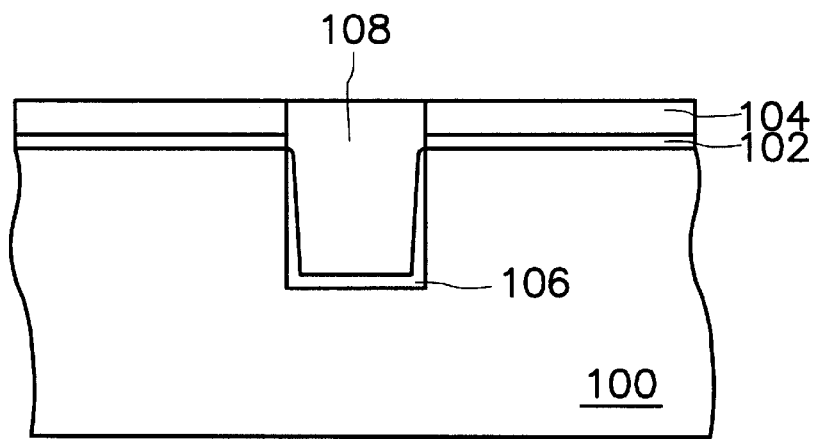
Figure 1D:
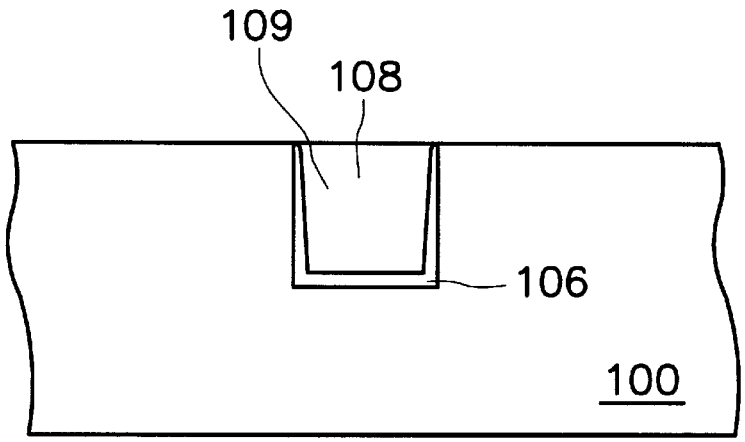
Figure 1E:
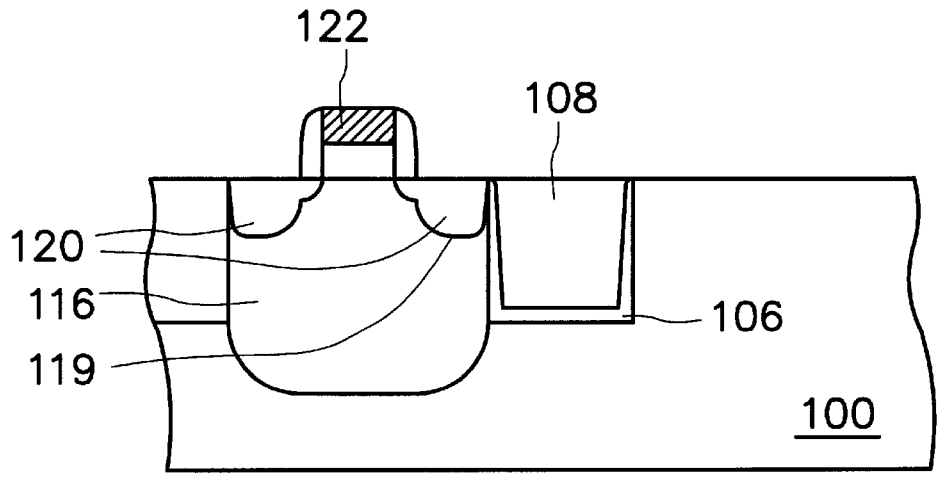
Figure 1F:
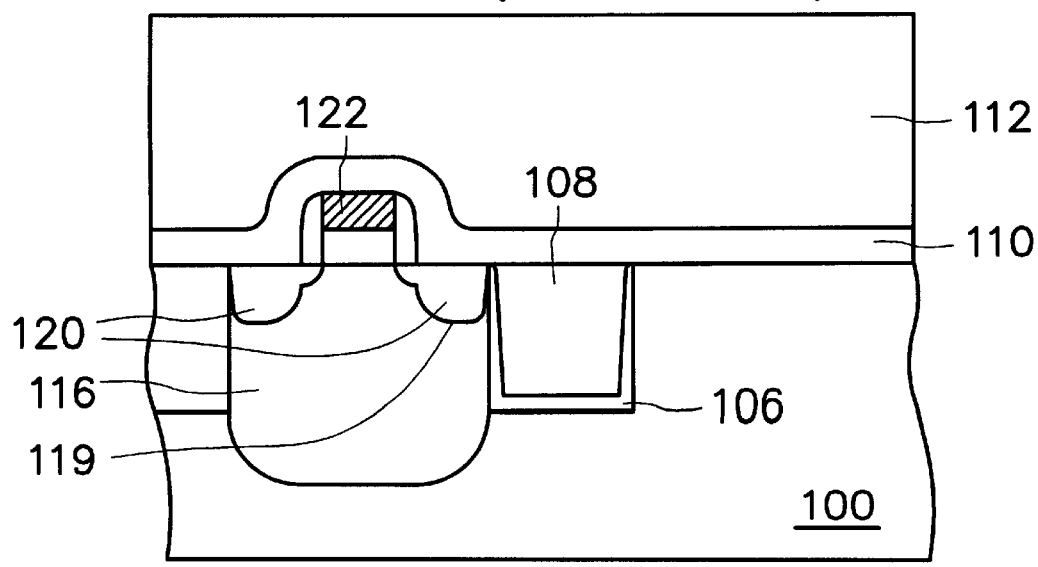
Figure 1G:
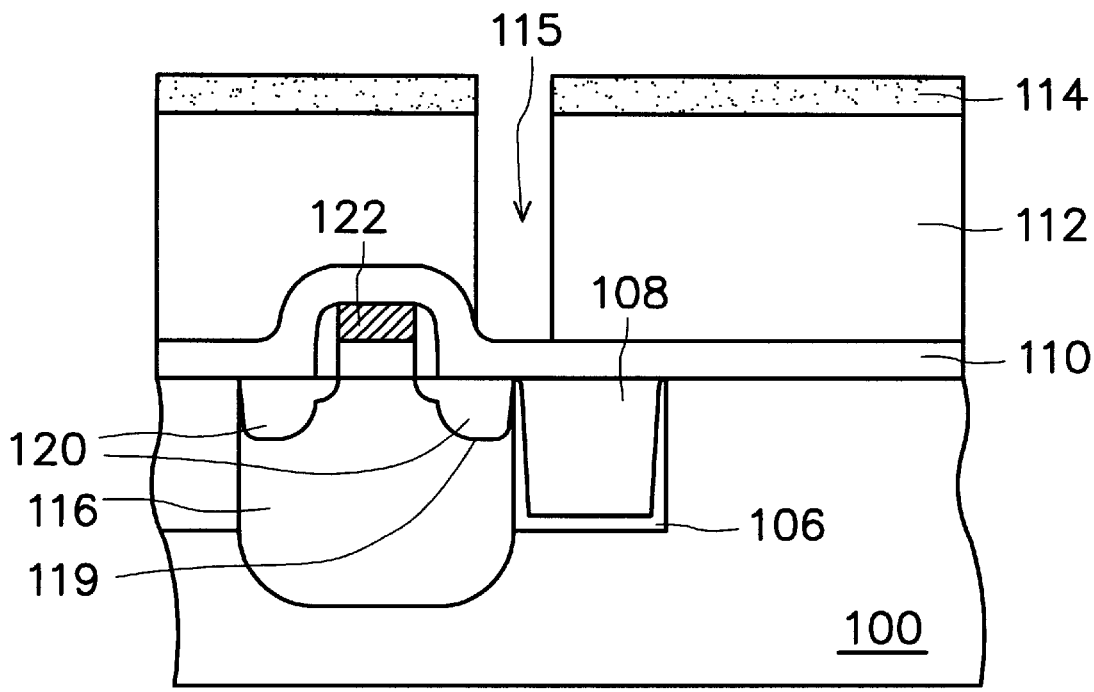
Figure 1H:
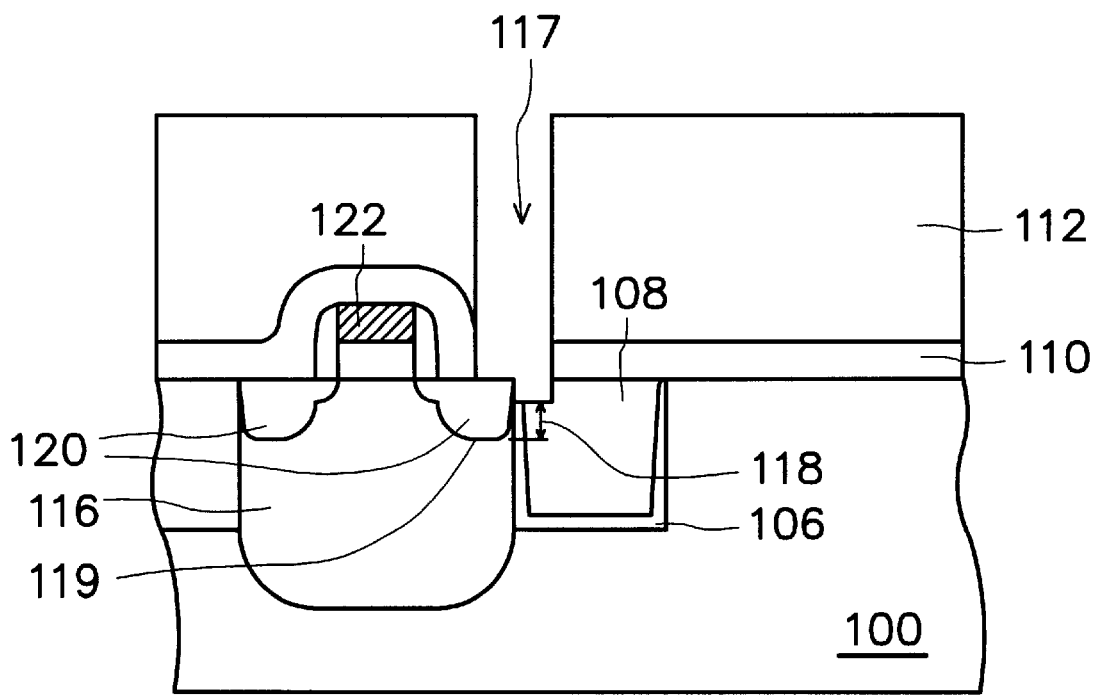

Reference will now be made in detail to the present preferred embodiments of the invention, examples of which are illustrated in the accompanying drawings. Wherever possible, the same reference numbers are used in the drawings and the description to refer to the same or like parts.

Reference is made to FIGS. 2A through 2H, which explain a method of fabricating a shallow trench isolation that can be utilized in a borderless contact fabrication process, according to one embodiment of the invention.

Figure 2A:
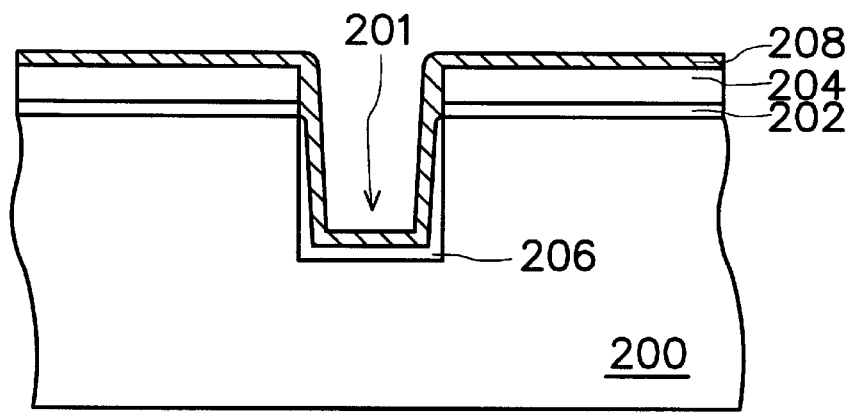
FIGS. 2A through 2H are schematic, cross-sectional views showing a method of fabricating a shallow trench isolation according to one embodiment of the invention.
Figure 2B:
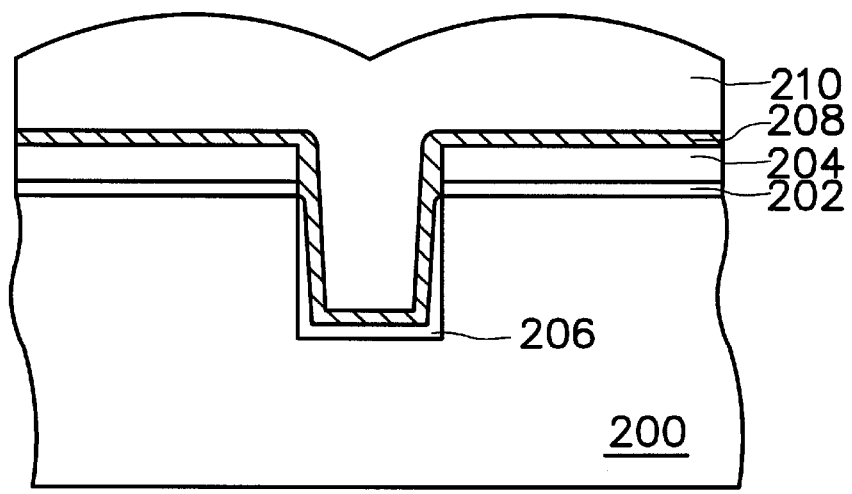

In FIG. 2A, a pad oxide layer 202 and a mask layer 204 are formed on a substrate 200. The pad oxide layer 202 is used to protect the substrate 200. The material of the mask layer 204 can be, for example, silicon oxide. The pad oxide layer 202, the mask layer 204, and the substrate 200 are patterned to form a trench 201 in the substrate 200. A liner oxide layer 206 is formed on the substrate 200 exposed in the trench 201. An isolation layer 208, which is conformal to the trench 201, is formed over the substrate 200. To advantage the following fabrication process, the material of the isolation layer 208 is selected from those material, for example, silicon-rich oxide ($Si_{1+x}O_2$) or silicon-rich nitride ($Si_{3+x}N_4$), with an etching rate much slower than the etching rate of silicon oxide ($SiO_2$) or silicon nitride ($Si_3N_4$). The thickness of the isolation layer 208 preferably is about 200 Å to 300 Å. The isolation layer 208 can be formed by, for example, thermal oxidation or chemical vapor deposition In FIG. 2B, an oxide layer 210 is formed over the substrate 200 to fill the trench 201. The oxide layer 210 can be, for example, formed by atmospheric-pressure chemical vapor deposition (APCVD) or high-density pressure chemical vapor deposition (HDPCVD).

Figure 2C:
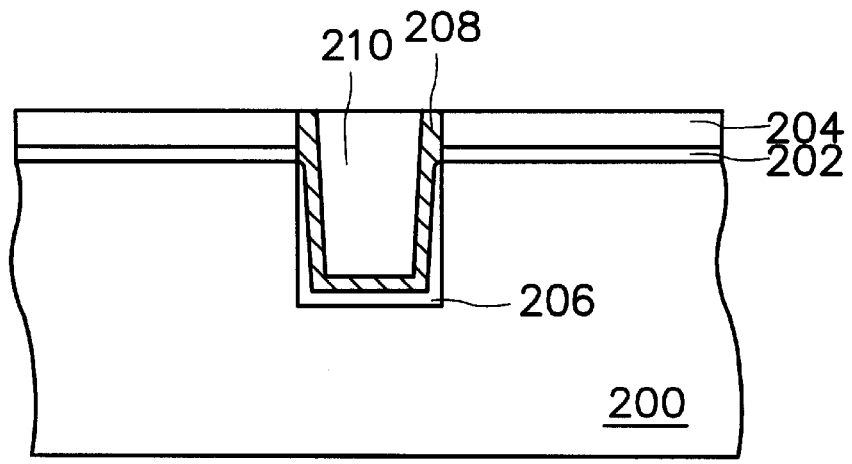

In FIG. 2C, a portion of the oxide layer 210 and the isolation layer 208 are removed by, for example, chemical-mechanical polishing, until the mask layer 204 is exposed.

Figure 2D:
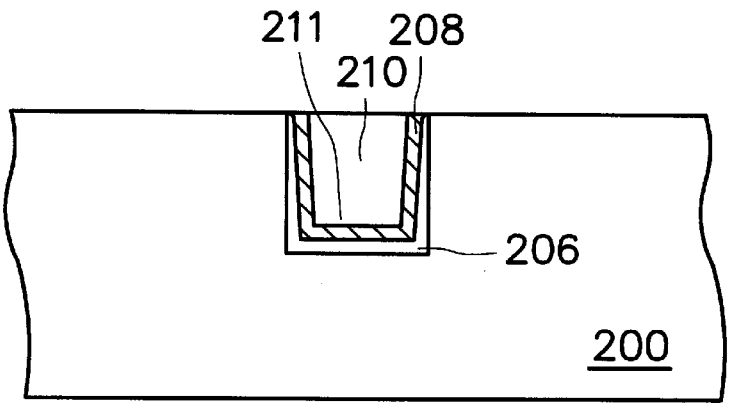

In FIG. 2D, the mask layer 204 and the pad oxide layer 202 are removed. A shallow trench isolation 211 is formed. The mask layer 204 can be removed by using a hot $H_3PO_4$ solution, for example, which also simultaneously removes a portion of the isolation layer 208. The pad oxide layer 202 can be removed by hydrofluoric (HF) etching, for example, which simultaneously removes a portion of the oxide layer 210. The shallow trench isolation 211 thus composes of the liner oxide layer 206, the isolation layer 208, and the oxide layer 210.

In a borderless contact fabrication process, a portion of the oxide layer 210 is etched when the misalignment occurs. The purpose of the invention is to provide an isolation layer 208 which is not etched even if the oxide layer 210 is etched. In this manner, shallow trench isolation 211, which comprises the isolation layer 208, as formed in the invention still provides good isolation ability after the over-etching occurs. Reference is now made to FIGS. 2E through 2H, which explain how the fabricating process described in this paragraph is performed.

Figure 2E:
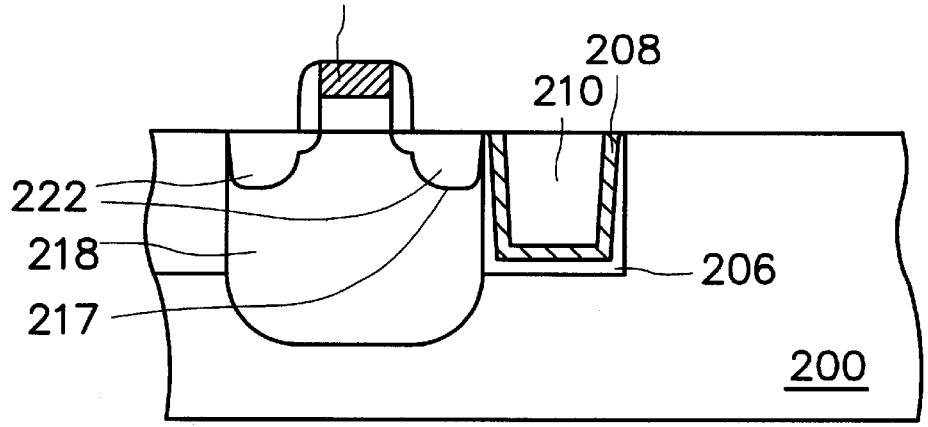

In FIG. 2E, a P-well 218 is formed in the substrate 200 and next to the shallow trench isolation 211. An NMOS is formed on the P-well 218. In this embodiment, the NMOS is taken as an example. It is appreciated the technique disclosed in this invention may also be used to form a PMOS in an N-well, or an N-type substrate by interchanging N to P and P to N. The NMOS comprises a gate 224 formed on the substrate 200 and a conductive region 222, such as a source/drain region, in the P-well 218 beside the gate 224.

A PN junction 217 is formed at the junction between the conductive region 222 and the P-well 218.

Figure 2F:
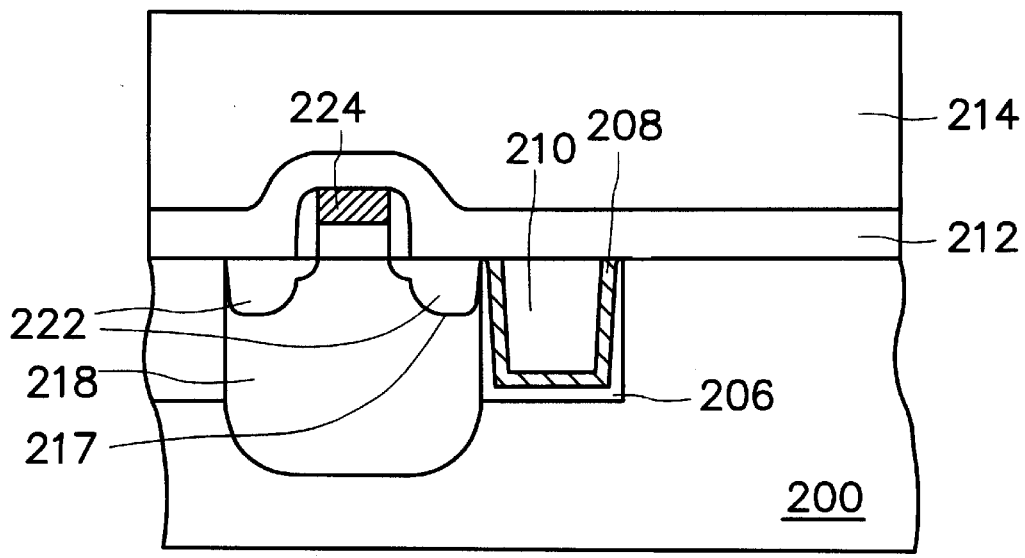

In FIG. 2F, a stop layer 212 is formed over the substrate 200 to cover the NMOS and the shallow trench isolation 211. The material of the stop layer 212 can be, for example, silicon nitride. An interlayer dielectric 214 is formed on the stop layer 212. The material of the interlayer dielectric 214 can be, for example, borophosphosilicate glass (BPSG). The interlayer dielectric 214 can be formed, for example, by chemical vapor deposition (CVD).

Figure 2G:
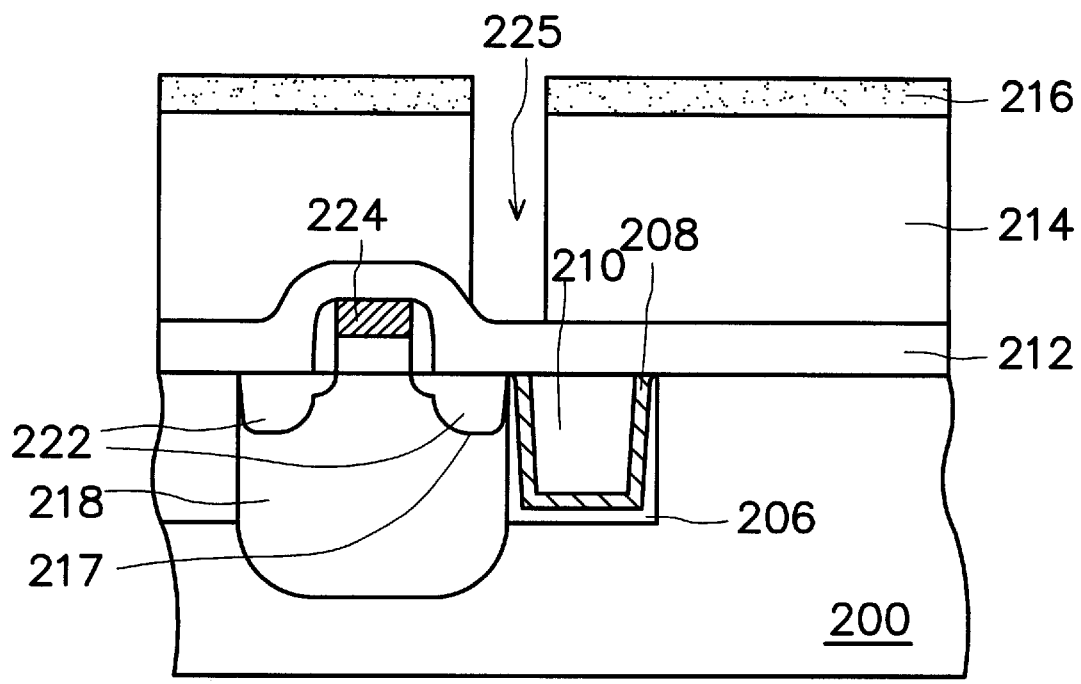

In FIG. 2G, a borderless contact fabrication process is performed. A patterned mask layer 216 is formed on the interlayer dielectric 214. Ideally, the patterned mask layer 216 has an opening exposing a portion of the interlayer dielectric 214 aligned over the conductive region 222. However, it is often, as shown in FIG. 2G, an opening 225 is misaligned to cover the portion of the interlayer dielectric 214 across both the conductive region 222 and the shallow trench isolation 210. Using the patterned mask layer 216 is used as an etching mask. The interlayer dielectric 214 exposed by the patterned mask layer 216 is removed to expose the stop layer 212. The opening 225 is formed.

Figure 2H:
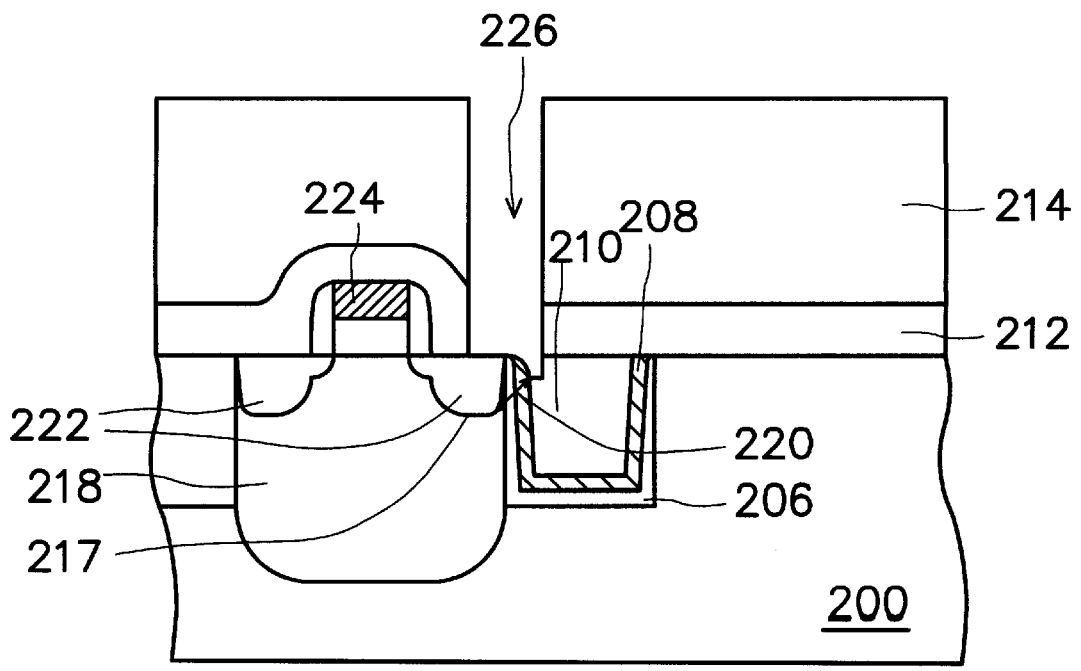

In FIG. 2H, the stop layer 212 exposed by the opening 225 is removed. The mask layer 216 is removed. A metallic contact opening 226 is formed as shown in FIG. 2H. In order to remove completely the stop layer 212, over-etching often occurs. When the metallic contact opening 226 and the conductive region 222, such as a source/drain region, are misaligned, a portion of the oxide layer 210 in the shallow trench isolation 211 is exposed by the opening 226 and may be removed. In the invention, the isolation layer 208 is formed in shallow trench isolation 211. As mentioned above, the interlayer dielectric 214 is preferably formed by material such as BPSG. Since the isolation layer 208 is formed by material having an etching rate much slower than oxide, though a portion of the oxide layer 210 is very likely to be removed. The isolation layer 208 is, on the contrary, very difficult to be removed. Furthermore, the isolation distance 220 between the metallic contact opening 226 and the PN junction 217 is increased by formation of the isolation layer 208. Thus, current leakage does not occur and the shallow trench isolation 211 retains its isolation ability.

In the invention, the liner of the shallow trench isolation 211 comprises a liner oxide layer 206 and the isolation layer 208. In contrast with the conventional shallow trench isolation, which only uses liner oxide layer as its liner, the liner thickness of the shallow trench isolation 211 in the invention is higher than that in the conventional shallow trench isolation. Thus, the isolation distance 220 between the metallic contact opening 226 and the PN junction 217 is increased, which increases the isolation ability. In addition, current leakage and device short do not occur. The performance of devices can be further increased.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a shallow trench isolation, comprising the steps of:

forming a pad oxide layer and a mask layer over a substrate;

patterning the pad oxide layer, the mask layer, and the substrate to form a trench in the substrate;

forming a liner oxide layer on the substrate, wherein the liner oxide layer is conformal to the trench;

forming an isolation layer over the substrate to cover the liner oxide layer, wherein the isolation layer is conformal to the trench;

filling the trench with an oxide layer;

removing a portion of the oxide layer and the isolation layer until the mask layer is exposed, by performing a chemical-mechanical polishing step; and removing the mask layer and the pad layer.

2. The method of claim 1, wherein the isolation layer comprises a silicon-rich oxide.

3. The method of claim 1, wherein the isolation layer comprises a silicon-rich nitride.

4. The method of claim 1, wherein thickness of the isolation layer is about 200 Å to 300 Å.

5. The method of claim 1, wherein the step of forming the isolation layer comprises thermal oxidation.

6. The method of claim 1, wherein the step of forming the isolation layer comprises chemical vapor deposition.

7. The method of claim 1, wherein the step of forming the oxide layer comprises atmospheric-pressure chemical vapor deposition.

8. The method of claim 1, wherein the step of forming the oxide layer comprises high-density plasma chemical vapor deposition.

9. A method of fabricating a contact opening, comprising the steps of:

forming a pad oxide layer and a mask layer over a substrate;

patterning the pad oxide layer, the mask layer, and the substrate to form a trench in the substrate;

forming a liner oxide layer on the substrate, wherein the liner oxide layer is conformal to the trench;

forming an isolation layer over the substrate to cover the liner oxide layer, wherein the isolation layer is conformal to the trench;

forming an oxide over the substrate to fill the trench;

removing a portion of the oxide layer and the isolation layer until the mask layer is exposed, by performing a chemical-mechanical polishing step;

removing the mask layer and the pad oxide layer to form a shallow trench isolation in the substrate;

forming a metallic oxide semiconductor (MOS), wherein the MOS has a conductive region in the substrate adjacent to the shallow trench isolation;

forming a stop layer over the substrate to cover the MOS and the shallow trench isolation, wherein the stop layer is comprised of silicon nitride;

forming an interlayer dielectric over the substrate to cover the stop layer, wherein the interlayer dielectric is comprised of borophosphosilicate;

patterning the interlayer dielectric to form an opening until the stop layer is exposed, wherein the opening is above the conductive region; and removing the stop layer exposed by the opening.

10. The method of claim 9, wherein the isolation layer comprises a silicon-rich oxide.

11. The method of claim 9, wherein the isolation layer comprises a silicon-rich nitride.

12. The method of claim 9, wherein thickness of the isolation layer is about 200 Å to 300 Å.

13. The method of claim 9, wherein the step of forming the isolation layer comprises thermal oxidation.

14. The method of claim 9, wherein the step of forming the isolation layer comprises chemical vapor deposition.

* * * * *